United States Patent
Newcombe

(10) Patent No.: US 7,342,393 B2
(45) Date of Patent: Mar. 11, 2008

(54) MULTIMETER WITH FILTERED MEASUREMENT MODE

(75) Inventor: Charles B Newcombe, Everett, WA (US)

(73) Assignee: Fluke Corporation, Everett, WA (US)

(*) Notice: Subject to any disclaimer, the term of this patent is extended or adjusted under 35 U.S.C. 154(b) by 0 days.

(21) Appl. No.: 11/354,466

(22) Filed: Feb. 14, 2006

(65) Prior Publication Data
US 2006/0139024 A1  Jun. 29, 2006

Related U.S. Application Data

(62) Division of application No. 10/800,924, filed on Mar. 15, 2004, now Pat. No. 7,034,517.

(51) Int. Cl.
  *G01R 15/00*  (2006.01)
(52) U.S. Cl. .......... 324/115; 324/133; 324/99 D; 324/158.1
(58) Field of Classification Search .......... None
  See application file for complete search history.

(56) References Cited

U.S. PATENT DOCUMENTS

| | | | |
|---|---|---|---|
| 3,157,045 A * | 11/1964 | Maki | 73/664 |
| 3,519,926 A * | 7/1970 | Chandos | 324/76.29 |
| 4,001,697 A | 1/1977 | Withers et al. | 327/104 |
| 4,164,624 A | 8/1979 | Ogita | 381/7 |
| 4,789,824 A | 12/1988 | Henkelmann | 324/114 |
| 5,446,371 A | 8/1995 | Eccleston et al. | 324/121 R |
| 5,473,244 A | 12/1995 | Libove et al. | 324/126 |
| 5,530,373 A | 6/1996 | Gibson et al. | 324/758 |
| 5,698,984 A | 12/1997 | Little et al. | 324/601 |
| 5,930,745 A | 7/1999 | Swift | 702/190 |
| 6,043,640 A | 3/2000 | Lauby et al. | 324/127 |
| 6,094,045 A | 7/2000 | Zoellick | |
| 6,392,402 B1 | 5/2002 | Swift | 324/132 |
| 6,731,102 B2 | 5/2004 | Gregorec et al. | 324/99 D |
| 6,794,859 B2 | 9/2004 | Choi | 324/115 |
| 6,856,138 B2 | 2/2005 | Bohley | 324/534 |
| 6,919,729 B2 | 7/2005 | Tiefnig | 324/700 |
| 7,034,517 B2 * | 4/2006 | Newcombe | 324/115 |

* cited by examiner

*Primary Examiner*—Paresh Patel
(74) *Attorney, Agent, or Firm*—Richard A. Koske; James H. Walters

(57) ABSTRACT

A multimeter with a filtered measurement mode. By pressing a single button or key, a low-pass filter is switched into the signal path to filter voltage spikes, noise, and switching transients from pulse-width modulated pulses, or lower frequency sinusoidal signals with higher frequency components, and at the same time an on-screen icon indicates to a user that the filtered mode has been selected. The user can switch back and forth between filtered and unfiltered modes. The filtered measurement mode is useful in measuring the outputs of modern adjustable-speed motor drives, uninterruptible power sources, and switch power supplies.

11 Claims, 2 Drawing Sheets

MULTIMETER WITH FILTERED MEASUREMENT MODE

BACKGROUND OF THE INVENTION

This invention relates generally to digital multimeters, and in particular to a multimeter having a filtered measurement mode.

Digital multimeters measure a wide range of electrical parameters, such as a.c. and d.c. currents and voltages, and resistance as well as physical parameters that can be converted to electrical signals, such as temperature, capacitance, and frequency of events. One commercially available family of digital multimeters favored and used by professional electricians is the Fluke 80 Series. These multimeters have additional measurement capabilities, including true RMS (root-mean-square) voltage measurement, freezing a measurement in a so-called "hold" mode, measuring the minimum and maximum (Min/Max) voltages of a varying signal, and making diode checks. Because these multimeters are capable of accurate RMS voltage measurements over a broad band of frequencies, they are a versatile tool for investigation of power quality problems, such as transients and harmonics.

However, there are a number of measurement situations confronting the technician in which it is extremely difficult to make accurate measurements. For example, modern adjustable speed motor drives, uninterruptible power sources, and switching power supplies use pulse-width modulation using high frequency, high voltage pulses to generate pulse-width modulated pulses, or lower frequency sinusoidal signals, with higher frequency components in the form of switching transients and voltage spikes superimposed on the signals. The resultant RMS voltage measurement values read erroneously higher than they should because total energy of the combined outputs is being measured.

It would be desirable to add a measurement feature in which switching transients and voltage spikes are filtered for low-frequency measurements without compromising the broadband measurement capabilities of the multimeter.

SUMMARY OF THE INVENTION

In accordance with the present invention, a multimeter with a filtered measurement mode is provided.

A multimeter includes conventional input circuitry for signal conditioning and range selection. The output of the signal conditioning circuit is applied to both a low-pass filter and one input of a programmable switching circuit. The output of the low-pass filter is applied to a second input of the programmable switching circuit. When a filtered measurement mode is selected, a single front-panel button is pressed and a command signal from a microcontroller is sent to the programmable switching circuit to select the filter output which is then applied to an RMS converter. At the same time, an indicator alerts the user that the filtered measurement mode has been selected and is in use so that mistakes are not made when the low-pass filter is no longer needed. In the preferred embodiment; the indicator is an on-screen icon that is displayed when the filtered measurement mode is active.

The programmable switching circuit also allows selection between the output of the RMS converter and the output of the low-pass filter for further processing by measurement circuitry. In addition, the filtered measurement mode facilitates the ability to accurately measure the frequency of a variable-speed motor drive using the conventional frequency measurement circuit of the multimeter.

A multimeter with a filtered measurement mode in accordance with the present invention is extremely useful in measuring the outputs of modern adjustable speed motor drives, uninterruptible power sources, and switching power supplies which use pulse-width modulation using high frequency, high voltage pulses to generate low-frequency sinewave outputs.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
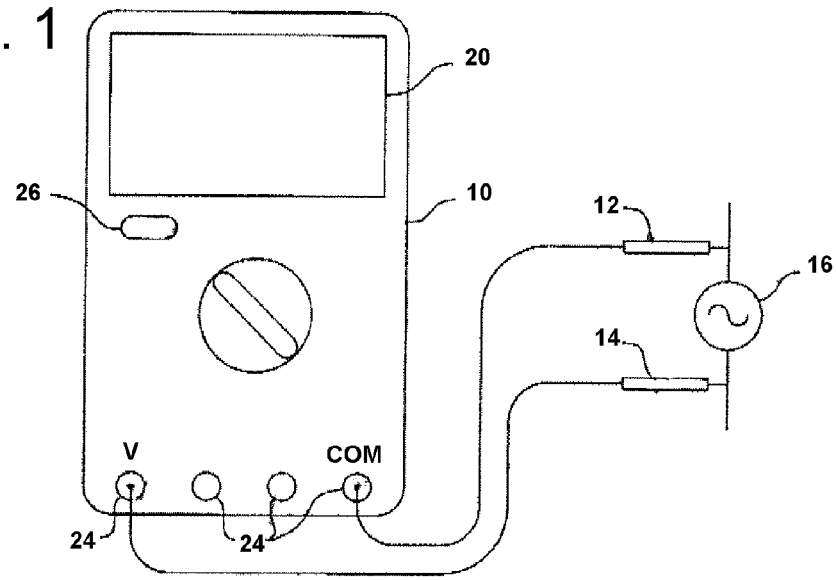
FIG. 1 is a schematic plan view drawing of a multimeter incorporating the present invention.

Referring to FIG. 1 of the drawings, there is shown a schematic plan view drawing of a digital multimeter 10 having a pair of test leads 12 and 14 connected to a circuit under test 16. The details shown in the plan view are referred to as the user interface, and include a display screen 20 for viewing measurement results, a rotary switch 22 for selecting measurement functions and ranges, a plurality of input jacks 24 including at least a volts (V) jack and a common (COM) jack for receiving test leads 12 and 14, and one or more mode-selecting push-button switches or keys 26 for selecting operating modes. For purposes of explaining this invention, key 26 selects between a filtered measurement mode and a normal operating mode.

Figure 2:
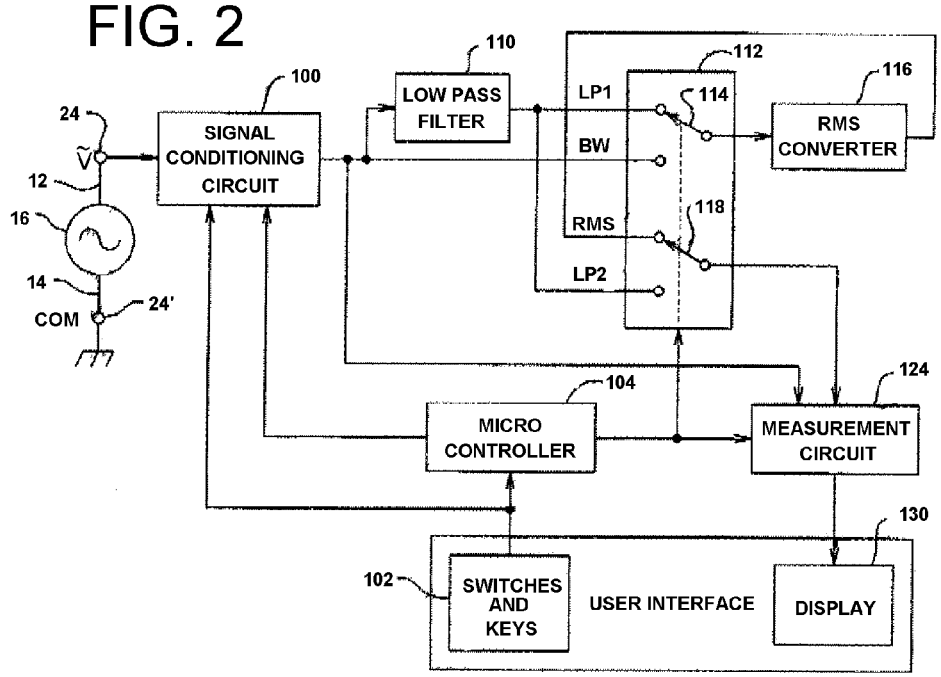
FIG. 2 is a partial block diagram of a multimeter showing an implementation of the present invention.

FIG. 2 is a partial block diagram of the multimeter 10 of FIG. 1. A circuit under test 16 is connected to input jacks 24 (V) and 24' (COM) via test leads 12 and 14 as described above in connection with FIG. 1. The input signal is applied to a signal conditioning circuit 100, where it is processed in accordance with the operating mode, function, and ranges selected by interface switches 102 and a microcontroller 104. Interface switches 102 includes the aforementioned push-button switch 26 for selecting between a filtered measurement mode and a normal operating mode, which in the preferred embodiment means a full-bandwidth measurement range of 20 kilohertz. Signal conditioning circuit 100 may suitably include, for example, an input ranging circuit such as that shown in U.S. Pat. No. 6,094,045 to Raymond D. Zoellick.

The output signal conditioning circuit 100 is applied to a low-pass filter 110 and to a BW input of a programmable switch 112. The output of low-pass filter 110 is connected to an LP1 input and an LP2 input of programmable switch 112. Programmable switch 112 includes a first independent switch 114 that selects between the filtered signal at the LP1 input and the full bandwidth signal at the BW input upon command from microcontroller 104 in response to pressing key 26. The selected output of switch 114 is applied to an RMS converter circuit 116, which is a true RMS conversion circuit. That is, RMS converter 116 provides the RMS value of the applied voltage, as is well known by those having skill in the art.

The RMS value at the output of the RMS converter is applied to an RMS input of programmable switch 112. Programmable switch 112 includes a second independent switch 118 that selects between the filtered signal at the LP2 input and the RMS value at the RMS input upon command from microcontroller 104 in response to a function selected by interface switches 102.

The output of switch 118 is applied to measurement circuit 124, where the selected signals are processed and converted to measurement results for display on display device 130, which may suitably be liquid crystal display (LCD). Measurement circuit 124 may suitably include frequency counters, Min/Max peak detection, and other signal processing as well as magnitude measurement. These functions are common in modern multimeters.

It can be appreciated that in the normal operating mode of the multimeter, conditioned signals may be applied directly to measurement circuit 124, or through switches 114 and 118 and RMS converter 116 to provide an RMS value of the input voltage. For example, if the input signal is a d.c. voltage or a current, there is no need to route the conditioned signal through the RMS converter 116 and hence may be routed directly to the measurement circuit 124.

The low-pass filtered signal may be either routed through switches 114 and 118 and RMS converter 116 to provide an RMS value to be processed by the measurement circuit, 124, or via LP2 and switch 118 directly to the measurement circuit 124, depending on the measurement results desired. For example, if an adjustable speed motor drive is under test, the technician may be more interested in the frequency of the filtered sinewave signal from low-pass filter 110 rather than the RMS value.

Figure 3:
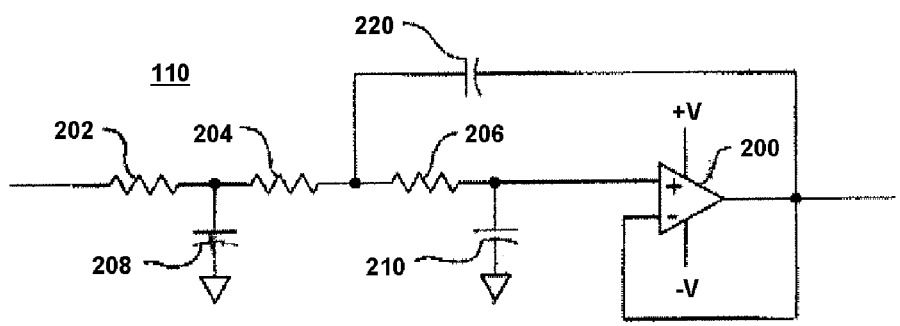
FIG. 3 is a schematic of a low-pass filter used in the preferred embodiment.

FIG. 3 is a schematic of a low-pass filter suitable for use as low-pass filter 110 in accordance with a preferred embodiment of the invention. The input path to the + input of operational amplifier 200 is via resistors 202, 204 and 206. Note that this is a.d.c. path. Capacitors 208 and 210 form with resistors 202, 204, and 206 an RC low-pass filter. The inverting (−) input of operational amplifier 200 is connected to its output, which is also connected to the junction of resistors 204 and 206 via a feedback capacitor 220. With the components values shown in Table 1, this filter has a frequency range of d.c. to a cutoff frequency of 800 Hertz. That is, signals having frequency components higher than 800 Hertz are effectively removed from the signal. Thus, voltage spikes, noise, and switching transients are removed from low-frequency sine waves, allowing a pure sine wave signal to be output.

TABLE 1

| | |
|---|---|
| 202 | 102 kΩ |
| 204 | 107 kΩ |
| 206 | 97.6 kΩ |
| 208 | 0.0027 μF |
| 210 | 390 pF |
| 220 | 0.0068 μF |

Figure 4:
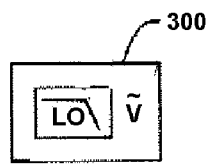
FIG. 4 is representative of a display icon indicating the filtered measurement mode.

As mentioned previously, the user of the multimeter may activate the filtered measurement mode simply by pushing key 26 on the front of the multimeter. Since a second push key 26 is required to de-activate the filtered mode, an indicator alerting the user of the selected filtered mode is useful in helping to prevent mistakes. While such an indicator could take many forms, including audible tones or lights, an on-screen icon 300 such as that shown in FIG. 4 may be generated to provide a clear indication that the filtered measurement mode has been selected. Icon 300 in accordance with the preferred embodiment shows a low-pass filter symbol with the word "LO" positioned inside, and "~V" to indicate a.c. voltage. Icon 300 disappears when the mode is switched back to normal.

It can be discerned that in a practical application of measuring the complex drive output of a variable-speed drive motor, the user can press one key or button to limit the RMS reading on the multimeter display to only the work-producing voltage applied to the motor, and at the same time, an icon appears in the display to indicate the filtered measurement mode. In addition, frequency measurements of the motor drive signal may also be made using the filtered measurement mode.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

I claim:

1. A multimeter, comprising:
   an input circuit for receiving voltage signals;
   a measurement circuit coupled to the output of said input circuit for processing said voltage signals to provide measurement results;
   a display device having a viewing screen for displaying said measurement results;
   a low-pass filter selectably disposed or not disposed between said input circuit and said measurement circuit, such that a filtered path is provided between the input circuit and the measurement circuit when said low-pass filter is selectably disposed, and an unfiltered path is provided between the input circuit and the measurement circuit when said low-pass filter is selectably not disposed; and
   an RMS converter circuit that is selectably interposed between an output of said low-pass filter in said filtered path and said measurement circuit or between said input circuit and said measurement circuit via said unfiltered path.

2. A multimeter in accordance with claim 1 where in said low-pass filter is selectably disposed or not disposed between said input circuit and said measurement circuit when a single key is pressed.

3. A multimeter in accordance with claim 2 wherein a low-pass filter mode indicator is provided when said single key is pressed.

4. A multimeter in accordance with claim 3 wherein said low-pass filter mode indicator is an icon that appears on said viewing screen.

5. A multimeter in accordance with claim 4 wherein said icon that appears on said viewing screen comprises the word "LO".

6. A multimeter, comprising:
   an input circuit for receiving voltage signals;
   a measurement circuit coupled to the output of said input circuit for processing said voltage signals to provide measurement results;
   a display device having a viewing screen for displaying said measurement results;
   a low-pass filter selectably disposed or not disposed between said input circuit and said measurement circuit, such that a filtered path is provided between the input circuit and the measurement circuit when said low-pass filter is selectably disposed, and an unfiltered path is provided between the input circuit and the measurement circuit when said low-pass filter is selectably not disposed;

an operational key, operatively related to said low-pass filter wherein said low-pass filter is selectably disposed or not disposed between said input circuit and said measurement circuit when said operational key is pressed;

a low-pass filter mode indicator for indicating when said low-pass filter is selectably disposed between said input circuit and said measurement circuit; and an RMS converter circuit that is selectably interposed between an output of said low-pass filter in said filtered path and said measurement circuit or between said input circuit and said measurement circuit via said unfiltered path.

7. A multimeter in accordance with claim 6 wherein said low-pass filter mode indicator is an icon that appears on said viewing screen.

8. A multimeter in accordance with claim 7 wherein said icon that appears on said viewing screen comprises the word "LO".

9. A multimeter in accordance with claim 6 wherein said low-pass filter mode indicator is an audible tone.

10. A multimeter in accordance with claim 6 wherein said low-pass filter mode indicator is a light.

11. A multimeter, comprising:

an input circuit for receiving voltage signals;

a measurement circuit coupled to an output of said input circuit for processing said voltage signals to provide measurement results;

a display device having a viewing screen for displaying said measurement results;

a low-pass filter selectably disposed or not disposed between said output of said input circuit and said measurement circuit, such that a filtered path is provided between the input circuit and the measurement circuit when said low-pass filter is selectably disposed, and an unfiltered path is provided between the input circuit and the measurement circuit when said low-pass filter is selectably not disposed;

an operational key adapted for manual actuation by a user, said operational key being operatively related to said low-pass filter wherein said low-pass filter is selectably disposed or not disposed between said output of said input circuit and said measurement circuit when said operational key is pressed;

a low-pass filter mode indicator for indicating when said low-pass filter is selectably disposed between said output of said input circuit and said measurement circuit, said indicator selected from the group consisting of an icon that appears on said viewing screen, an audible tone, or a light; and an RMS converter circuit that is selectably interposed between an output of said low-pass filter in said filtered path and said measurement circuit or between said output of said input circuit and said measurement circuit via said unfiltered path.

* * * * *